United States Patent
Hsiao

(10) Patent No.: US 9,720,610 B2
(45) Date of Patent: Aug. 1, 2017

(54) LOW POWER CONSUMPTION MEMORY DEVICE

(71) Applicant: Chih-Cheng Hsiao, Taichung (TW)

(72) Inventor: Chih-Cheng Hsiao, Taichung (TW)

( * ) Notice: Subject to any disclaimer, the term of this patent is extended or adjusted under 35 U.S.C. 154(b) by 272 days.

(21) Appl. No.: 14/561,563

(22) Filed: Dec. 5, 2014

(65) Prior Publication Data

US 2016/0034220 A1 Feb. 4, 2016

(30) Foreign Application Priority Data

Jul. 31, 2014 (TW) .............................. 103126224 A

(51) Int. Cl.
| | | |
|---|---|---|
| G11C 8/08 | (2006.01) | |
| G06F 9/46 | (2006.01) | |
| G06F 12/00 | (2006.01) | |
| G06F 3/06 | (2006.01) | |
| G11C 7/12 | (2006.01) | |
| G11C 7/18 | (2006.01) | |
| G11C 11/412 | (2006.01) | |

(52) U.S. Cl.
CPC .......... *G06F 3/0625* (2013.01); *G06F 3/0659* (2013.01); *G06F 3/0683* (2013.01); *G11C 7/12* (2013.01); *G11C 7/18* (2013.01); *G11C 11/412* (2013.01); *G11C 2207/005* (2013.01)

(58) Field of Classification Search
CPC .............................. G06F 3/0659; G06F 3/0683
USPC ........................................................ 711/154
See application file for complete search history.

(56) References Cited

U.S. PATENT DOCUMENTS

| | | | | | |
|---|---|---|---|---|---|
| 6,782,410 | B1 * | 8/2004 | Bhagat | .................. | G06F 9/5027 709/201 |
| 6,842,377 | B2 * | 1/2005 | Takano | ................ | G11C 7/1021 365/185.21 |
| 7,017,011 | B2 * | 3/2006 | Lesmanne | ............. | G06F 12/082 711/141 |
| 7,196,942 | B2 * | 3/2007 | Khurana | ............... | G11C 7/1051 326/38 |
| 7,321,955 | B2 * | 1/2008 | Ohmura | .............. | G06F 12/0804 711/113 |
| 7,512,736 | B1 * | 3/2009 | Overby | ................. | G06F 3/0607 707/999.202 |

(Continued)

FOREIGN PATENT DOCUMENTS

| | | |
|---|---|---|
| JP | 2007273007 A | 10/2007 |
| JP | 2013118023 A | 6/2013 |

(Continued)

*Primary Examiner* — Tuan Thai
*Assistant Examiner* — Mohamed Gebril
(74) *Attorney, Agent, or Firm* — Winston Hsu

(57) ABSTRACT

A memory device includes a plurality of memory modules and a plurality of control lines. Each memory module includes a plurality of memory units. Each memory unit includes: a plurality of memory cell groups, each of which includes at least one memory cell; a plurality of first bit lines, each of which is coupled to the at least one memory cell of a respective memory cell group; a second bit line; and a plurality of controllable circuits, each of which has an input terminal coupled to a respective first bit line, an output terminal coupled to the second bit line, and a control terminal. Each control line is coupled to the control terminal of a corresponding controllable circuit of each of at least one memory unit of each memory module. The memory device consumes relatively small power.

12 Claims, 12 Drawing Sheets

(56) References Cited

U.S. PATENT DOCUMENTS

| | | | | |
|---|---|---|---|---|
| 8,230,193 B2* | 7/2012 | Klemm | | G06F 3/0608 711/114 |
| 8,566,546 B1* | 10/2013 | Marshak | | G06F 3/0604 711/112 |
| 8,990,527 B1* | 3/2015 | Linstead | | G06F 3/0617 711/161 |
| 2004/0068621 A1* | 4/2004 | Van Doren | | G06F 12/0828 711/144 |
| 2005/0125607 A1* | 6/2005 | Chefalas | | G06F 12/0862 711/113 |
| 2007/0008328 A1* | 1/2007 | MacWilliams | | G06F 12/0646 345/530 |
| 2009/0094413 A1* | 4/2009 | Lehr | | G06F 3/0605 711/112 |
| 2009/0228648 A1* | 9/2009 | Wack | | G06F 11/1092 711/114 |
| 2010/0046267 A1* | 2/2010 | Yan | | G11C 16/24 365/51 |
| 2010/0050016 A1* | 2/2010 | Franklin | | G06F 11/0727 714/6.32 |
| 2010/0125712 A1* | 5/2010 | Murase | | G06F 11/1458 711/162 |
| 2010/0332780 A1* | 12/2010 | Furuya | | G06F 3/0689 711/162 |
| 2011/0202735 A1* | 8/2011 | Kono | | G06F 11/1451 711/162 |
| 2011/0235448 A1 | 9/2011 | Wu | | |
| 2011/0307745 A1* | 12/2011 | McCune | | G06F 17/30221 714/54 |
| 2012/0198107 A1* | 8/2012 | McKean | | G06F 13/18 710/40 |
| 2013/0007373 A1* | 1/2013 | Beckmann | | G06F 12/126 711/136 |
| 2013/0067161 A1* | 3/2013 | Chandra | | G06F 13/12 711/114 |
| 2013/0083592 A1 | 4/2013 | Kang | | |
| 2013/0111129 A1* | 5/2013 | Maki | | G06F 3/0611 711/117 |
| 2013/0148415 A1 | 6/2013 | Shu | | |
| 2013/0152097 A1* | 6/2013 | Boctor | | G06F 9/505 718/103 |
| 2013/0326270 A1* | 12/2013 | Chen | | G06F 11/2089 714/6.21 |
| 2014/0003114 A1* | 1/2014 | Pellizzer | | H01L 27/2481 365/63 |

FOREIGN PATENT DOCUMENTS

| | | |
|---|---|---|
| JP | 201478305 A | 5/2014 |
| WO | 2012081159 A1 | 6/2012 |

* cited by examiner

LOW POWER CONSUMPTION MEMORY DEVICE

CROSS-REFERENCE TO RELATED APPLICATIONS

This application claims priority to Taiwanese Application No. 103126224 filed on Jul. 31, 2014, the disclosure of which is incorporated in its entirety by reference herein.

TECHNICAL FIELD

The invention relates to a memory device, and more particularly to a low power consumption memory device.

BACKGROUND

Referring to FIG. 1, a conventional memory device includes a memory cell block 10, a plurality of bit lines 11 coupled to the memory cell block 10, and a plurality of word lines 12 coupled to the memory cell block 10.

The memory cell block 10 includes a plurality of memory cells 13 arranged in a matrix. The word lines 12 transmit a control input to the memory cells 13 in order to control the memory cells 13 to output data stored therein to the bit lines 11.

As the demand for storage capacity of memory devices increases, memory cell blocks 10 with many more memory cells 13 would be preferable. However, to accommodate this, each bit line 11 is made longer to be coupled to more memory cells 13, which inevitably increases a capacitance seen thereat.

Because of the relatively large capacitance seen at each bit line 11, voltages outputted by the memory cells 13 may not promptly propagate to the bit lines 11 (i.e., the memory cells 13 may not be able to drive the bit lines 11 efficiently). As a result, a plurality of sense amplifiers 14 are employed to be coupled respectively to the bit lines 11 to assist in amplifying voltages on the bit lines 11 in order to facilitate data transmission and allow the memory device to operate at a higher frequency.

Nonetheless, the sense amplifiers 14 may be undesirable components of the memory device due to their relatively large power consumption. Therefore, it may be beneficial to attempt to address the issue of the capacitance seen at each bit line 11, and to omit the sense amplifiers 14 altogether.

Referring to FIG. 2, alternatively, a plurality of memory cell blocks may be combined in a memory device and controlled together, such that control logic for the same can be simplified to save area. For example, the memory device includes four memory cell blocks, one-hundred-and-twenty-eight bit lines (bit0_bk0 to bit31_bk3) and two-hundred-and-fifty-six word lines (ctr_0 to ctr_255). Each memory cell block includes two-hundred-and-fifty-six by thirty-two memory cells (MCs) 13 that are arranged in a matrix with two-hundred-and-fifty-six rows and thirty-two columns, and that are controlled via the word lines (ctr_0 to ctr_255) to output data stored therein to the bit lines (bit0_bkA to bit31_bkA), where $0 \leq A \leq 3$. Moreover, thirty-two multiplexers (MUXs) 15 are employed to output voltages at the bit lines (bit0_bk0 to bit31_bk3) to thirty-two output lines (bit0 to bit31). Preferably, the columns of the memory cells 13 of the memory cell blocks are arranged in the order of the first column of the first memory cell block, the first column of the second memory cell block, the first column of the third memory cell block, the first column of the fourth memory cell block, the second column of the first memory cell block, the second column of the second memory cell block and so on, in order to facilitate routing of the bit lines (bit0_bk0 to bit31_bk3) and to decrease capacitances seen at the bit lines (bit0_bk0 to bit31_bk3).

However, when thirty-two of the memory cells 13 that correspond to the bit lines (bit0_bkA to bit31_bkA) and to the word line (ctr_B), are selected to have data stored therein be read, one-hundred-and-twenty-eight of the memory cells 13, that correspond to the word line (ctr_B), may charge or discharge the bit lines (bit0_bk0 to bkt31_bk3), where $0 \leq B \leq 255$. This results in a relatively large amount of unnecessary power consumption.

SUMMARY

Therefore, an object of this invention is to provide a memory device that can overcome at least one of the aforesaid problems associated with the prior art.

According to this invention, a memory device includes a plurality of memory modules and a plurality of control lines. The memory modules are arranged in a first direction. Each of the memory modules includes a plurality of memory units arranged in the first direction. Each of the memory units of the memory modules includes: a plurality of memory cell groups which are arranged in a second direction different from the first direction, and each of which includes at least one memory cell for storing data therein; a plurality of first bit lines, each of which is coupled to the at least one memory cell of a respective one of the memory cell groups; a second bit line for transmitting to-be-read data; and a plurality of controllable circuits, each of which has an input terminal coupled to a respective one of the first bit lines, an output terminal coupled to the second bit line, and a control terminal. Each of the control lines is coupled to the control terminal of a corresponding one of the controllable circuits of each of at least one of the memory units of each of the memory modules. Each of the controllable circuits of the memory units of the memory modules is operable between an output enable state and an output disable state based on a voltage at the input terminal and a voltage at the control terminal, and outputs a predetermined reference voltage at the output terminal when operating in the output enable state. Alternatively, each of the controllable circuits of the memory units of the memory modules is operable between the output enable state and the output disable state based on the voltage at the control terminal, and outputs, at the output terminal, a voltage associated with the voltage at the input terminal when operating in the output enable state.

BRIEF DESCRIPTION OF THE DRAWINGS

Other features and advantages of this invention will become apparent in the following detailed description of the embodiment of this invention with reference to the accompanying drawings, of which.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 3:
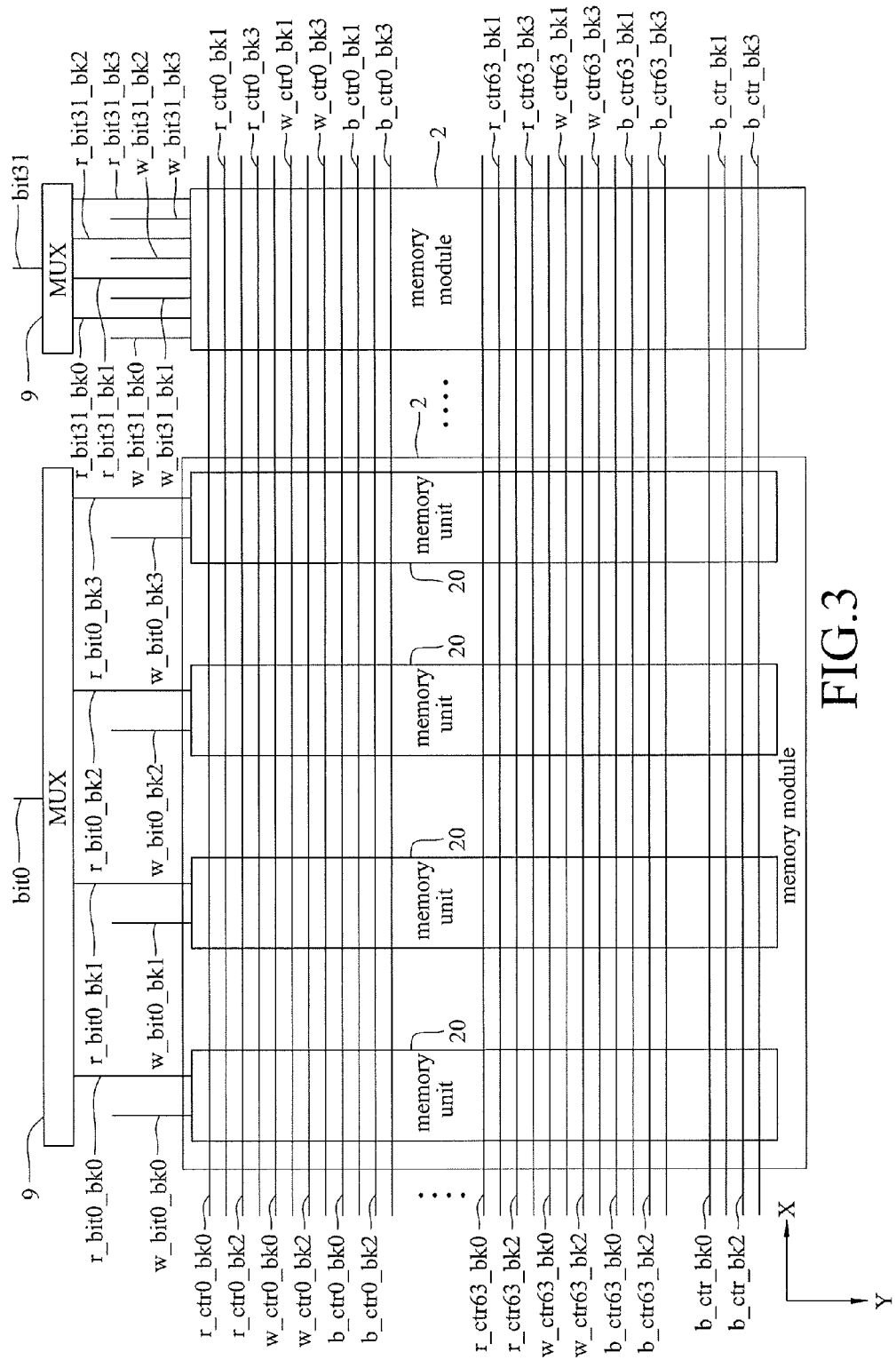
FIGS. 3 to 7 are schematic circuit block diagrams illustrating an embodiment of a memory device according to this invention.

Referring to FIG. 3, an embodiment of a memory device according to this invention includes a number (L) (e.g., 32) of memory modules 2, a number (L) (i.e., 32) of multiplexers (MUXs) 9, a number (M×N) (e.g., 4×64=256) of first control lines (r_ctr0_bk0 to r_ctr63_bk3), a number (M×N) (i.e., 4×64=256) of second control lines (w_ctr0_bk0 to w_ctr63_bk3), a number (M×N) (i.e., 4×64=256) of first bias lines (b_ctr0_bk0 to b_ctr63_bk3), a number (M) (i.e., 4) of second bias lines (b_ctr_bk0 to b_ctr_bk3) and a number (L) (i.e., 32) of output lines (bit0 to bit31). The memory modules 2 are arranged in a first direction (X), and each include a number (M) (i.e., 4) of memory units 20 arranged in the first direction (X).

Figure 4:
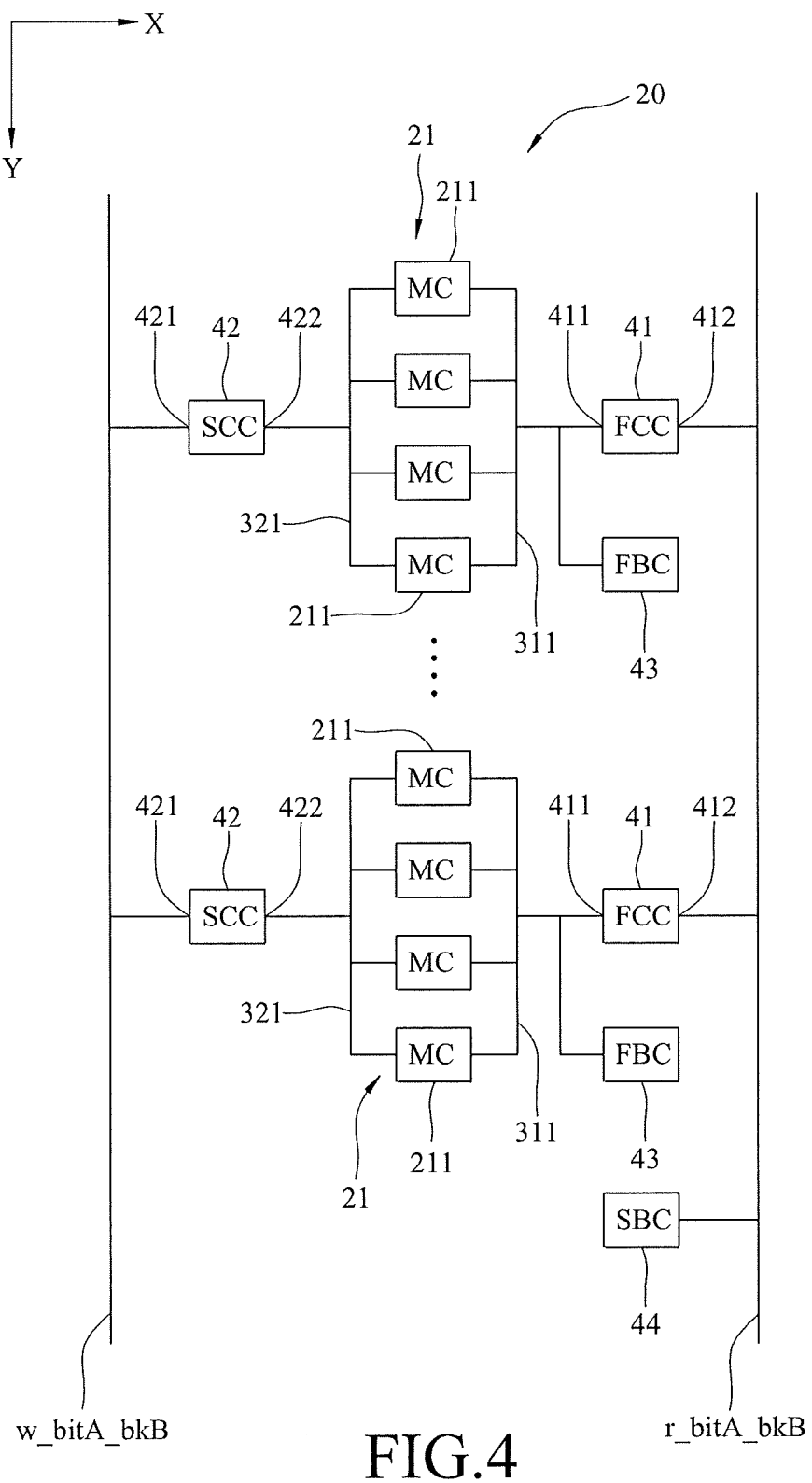

Referring to FIG. 4, each memory unit 20 includes a number (N) (i.e., 64) of memory cell groups 21, a number (N) (i.e., 64) of first controllable circuits (FCCs) 41, a number (N) (i.e., 64) of second controllable circuits (SCCs) 42, a number (N) (i.e., 64) of first biasing circuits (FBCs) 43, a second biasing circuit (SBC) 44, a number (N) (i.e., 64) of first bit lines 311, a second bit line (r_bitA_bkB), a number (N) (i.e., 64) of third bit lines 321 and a fourth bit line (w_bitA_bkB), where $0 \le A \le L-1$ (i.e., $0 \le A \le 31$) and $0 \le B \le M-1$ (i.e., $0 \le B \le 3$).

For each memory unit 20, the memory cell groups 21 are arranged in a second direction (Y) different from (e.g., transverse to) the first direction (X), and each include at least one memory cell (MC) 211 for storing data therein. In this embodiment, each memory cell group 21 includes, for example, four memory cells 211 arranged in the second direction (Y). Each first bit line 311 is coupled to the memory cells 211 of a respective memory cell group 21. The second bit line (r_bitA_bkB) is for transmitting to-be-read data. Each first controllable circuit 41 has an input terminal 411 coupled to a respective first bit line 311, an output terminal 412 coupled to the second bit line (r_bitA_bkB), and a control terminal 416 (see FIG. 5). Each third bit line 321 is coupled to the memory cells 211 of a respective memory cell group 21. The fourth bit line (w_bitA_bkB) is for transmitting to-be-written data. Each second controllable circuit 42 has an input terminal 421 coupled to the fourth bit line (w_bitA_bkB), an output terminal 422 coupled to a respective third bit line 321, and a control terminal 426 (see FIG. 6). Each first biasing circuit 43 is coupled to a respective first bit line 311. The second biasing circuit 44 is coupled to the second bit line (r_bitA_bkB).

Figure 5:
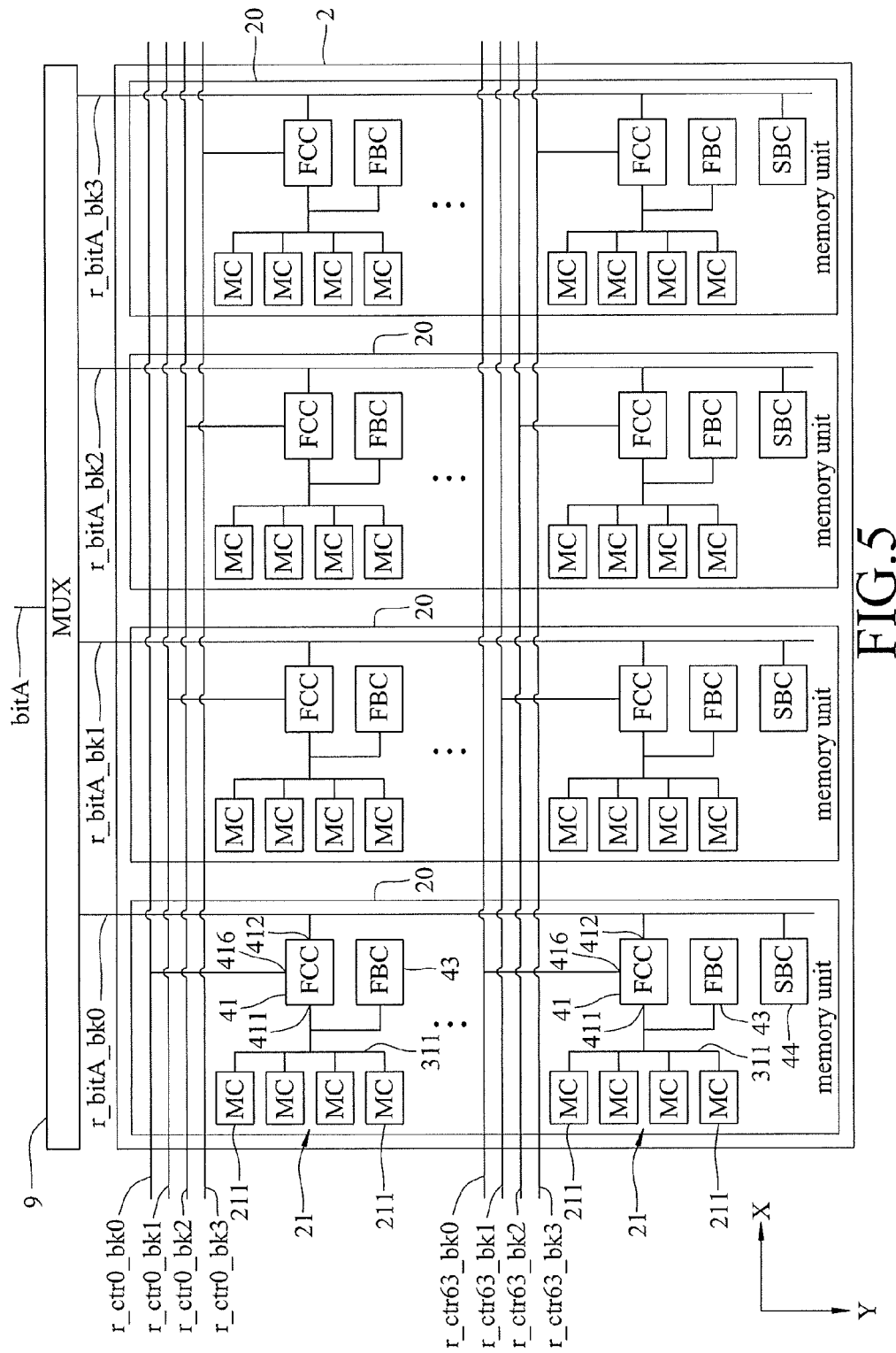

Referring to FIG. 5, in which the second control lines (w_ctr0_bk0 to w_ctr63_bk3) (see FIG. 3), the first bias lines (b_ctr0_bk0 to b_ctr63_bk3) (see FIG. 3), the second bias lines (b_ctr_bk0 to b_ctr_bk3) (see FIG. 3), and the third bit lines 321 (see FIG. 4), the fourth bit line (w_bitA_bkB) (see FIG. 4) and the second controllable circuits 42 (see FIG. 4) of each memory unit 20 are not depicted for simplicity of illustration, each first control line (r_ctrC_bkB) is coupled to the control terminal 416 of a respective first controllable circuit 41 of the memory units 20 of each memory module 2, where $0 \le B \le M-1$ (i.e., $0 \le B \le 3$) and $0 \le C \le N-1$ (i.e., $0 \le C \le 63$).

Figure 6:
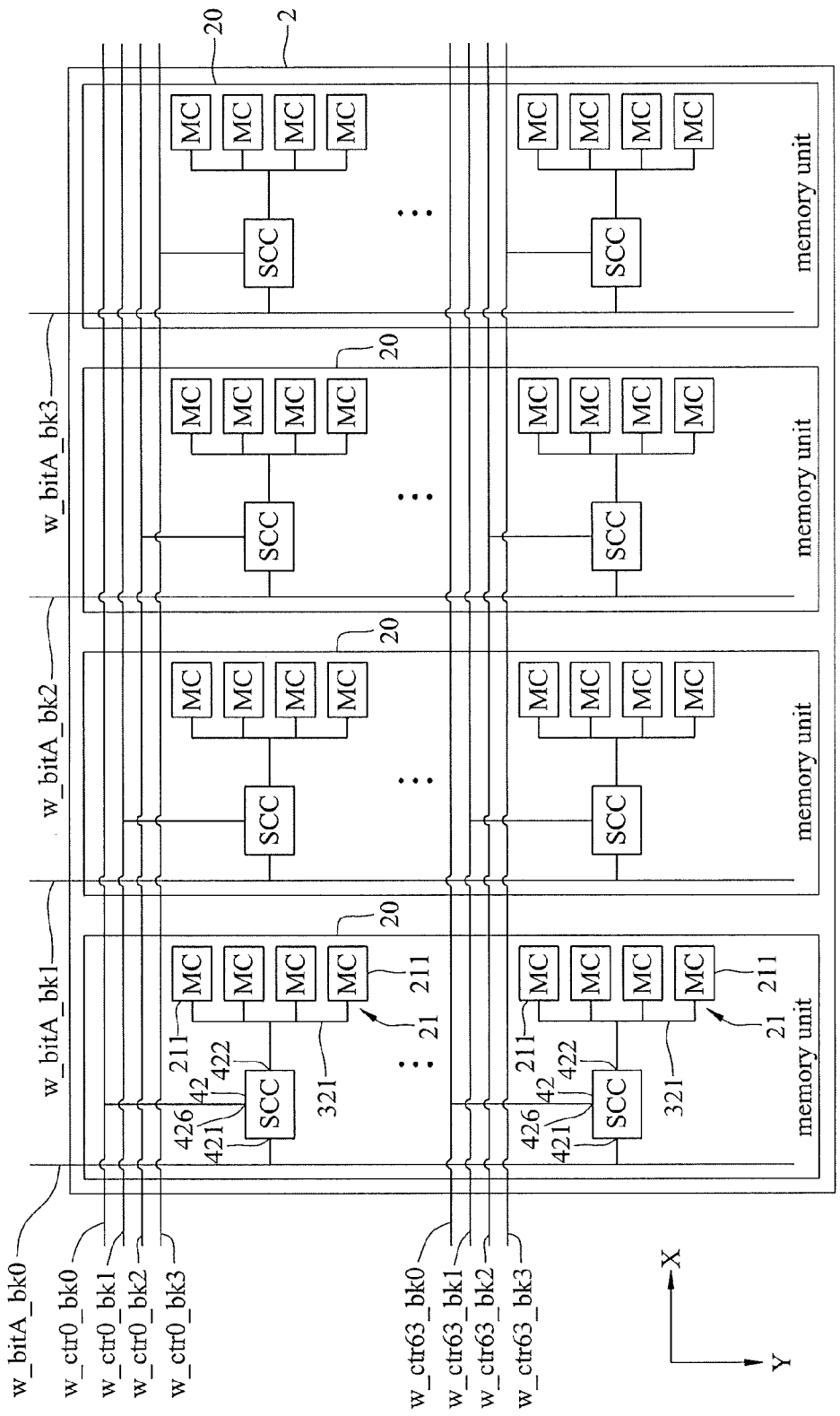

Referring to FIG. 6, in which the multiplexers 9 (see FIG. 3), the first control lines (r_ctr0_bk0 to r_ctr63_bk3) (see FIG. 3), the first bias lines (b_ctr0_bk0 to b_ctr63_bk3) (see FIG. 3), the second bias lines (b_ctr_bk0 to b_ctr_bk3) (see FIG. 3), the output lines (bit0 to bit31) (see FIG. 3), and the first bit lines 311 (see FIG. 4), the second bit line (r_bitA_bkB) (see FIG. 4), the first controllable circuits 42 (see FIG. 4), the first biasing circuits 43 (see FIG. 4) and the second biasing circuit 44 (see FIG. 4) of each memory unit 20 are not depicted for simplicity of illustration, each second control line (w_ctrC_bkB) is coupled to the control terminal 426 of a corresponding second controllable circuit 42 of a corresponding one of the memory units 20 of each memory module 2, where $0 \le B \le M-1$ (i.e., $0 \le B \le 3$) and $0 \le C \le N-1$ (i.e., $0 \le C \le 63$).

Figure 7:
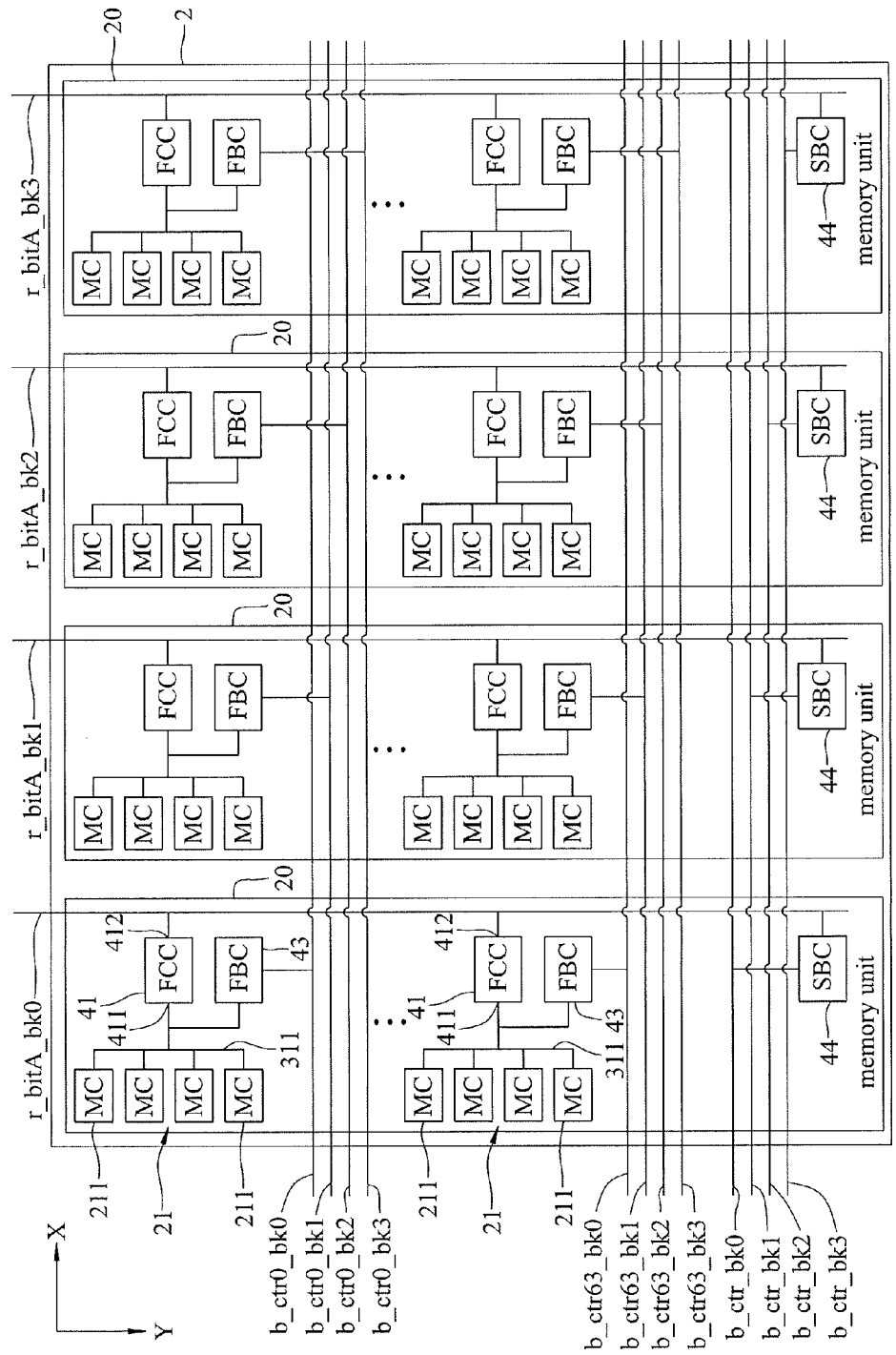

Referring to FIG. 7, in which the multiplexers 9 (see FIG. 3), the first control lines (r_ctr0_bk0 to r_ctr63_bk3) (see FIG. 3), the second control lines (w_ctr0_bk0 to w_ctr63_bk3) (see FIG. 3), the output lines (bit0 to bit31) (see FIG. 3), and the third bit lines 321 (see FIG. 4), the fourth bit line (w_bitA_bkB) (see FIG. 4) and the second controllable circuits 42 (see FIG. 4) of each memory unit 20 are not depicted for simplicity of illustration, each first bias line (b_ctrC_bkB) is coupled to a corresponding first biasing circuit 43 of a corresponding one of the memory units 20 of each memory module 2, where $0 \le B \le M-1$ (i.e., $0 \le B \le 3$) and $0 \le C \le N-1$ (i.e., $0 \le C \le 63$). Each second bias line (b_ctr_bkB) is coupled to the second biasing circuit 44 of a respective one of the memory units 20 of each memory module 2.

Referring to FIG. 5, each multiplexer 9 is coupled to the second bit lines (r_bitA_bk0 to r_bitA_bk3) of the memory units 20 of a respective memory module 2 and to a respective output line (bitA), and outputs one of voltages respectively at the second bit lines (r_bitA_bk0 to r_bitA_bk3) to the output line (bitA), where $0 \le A \le L-1$ (i.e., $0 \le A \le 31$).

In this embodiment, there are two implementations of the first controllable circuit 41.

In a first implementation, each first controllable circuit 41 is operable between an output enable state and an output disable state based on a voltage at the input terminal 411 thereof and a voltage at the control terminal 416 thereof, outputs a predetermined reference voltage (e.g., one of a logic high voltage and a logic low voltage) at the output terminal 412 thereof when operating in the output enable state, and does not output any voltage at the output terminal 412 thereof (i.e., exhibits high impedance at the output terminal 412 thereof) when operating in the output disable state. In addition, each first controllable circuit 41 is controlled via the corresponding first control line (r_ctrC_bkB) to operate in the output disable state when none of the memory cells 211 of the respective memory cell group 21 is selected to have data stored therein be read, and to operate in one of the output disable state and the output enable state based on a voltage at the respective first bit line 311 when one of the memory cells 211 of the respective memory cell group 21 is selected to have data stored therein be read, where $0 \le B \le M-1$ (i.e., $0 \le B \le 3$) and $0 \le C \le N-1$ (i.e., $0 \le C \le 63$).

In a second implementation, each first controllable circuit 41 is operable between the output enable state and the output disable state based on the voltage at the control terminal 416 thereof, outputs, at the output terminal 412 thereof, a voltage associated with the voltage at the input terminal 411 thereof when operating in the output enable state, and does not output any voltage at the output terminal 412 thereof (i.e., exhibits high impedance at the output terminal 412 thereof) when operating in the output disable state. In addition, each first controllable circuit 41 is controlled via the corresponding first control line (r_ctrC_bkB) to operate in the output disable state when none of the memory cells 211 of the respective memory cell group 21 is selected to have data stored therein be read, and to operate in the output enable state when one of the memory cells 211 of the respective memory cell group 21 is selected to have data stored therein be read, where $0 \le B \le M-1$ (i.e., $0 \le B \le 3$) and $0 \le C \le N-1$ (i.e., $0 \le C \le 63$).

Figure 8:
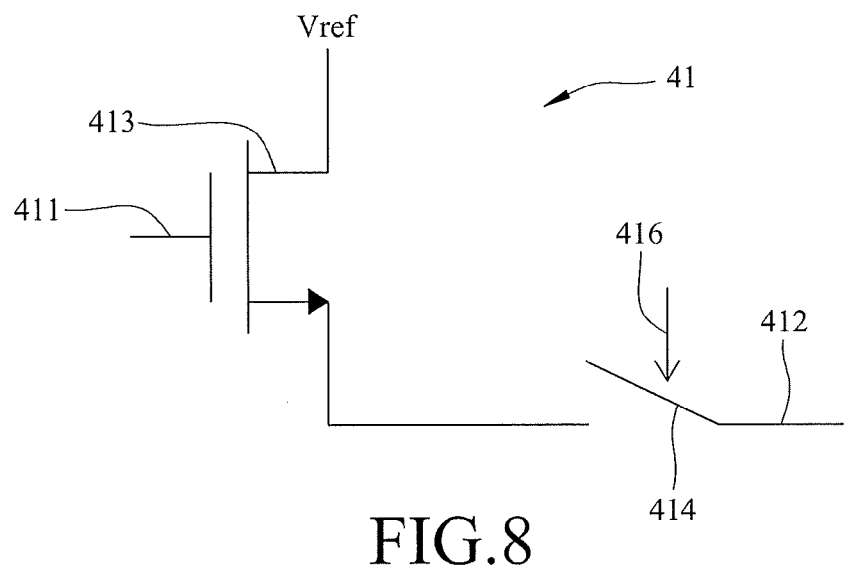
FIG. 8 is a schematic circuit diagram illustrating a first example of a first controllable circuit of the embodiment.

FIG. 8 illustrates an example of the first implementation of the first controllable circuit 41. In this example, each first controllable circuit 41 includes a transistor 413 for increasing output driving capability thereof, and a switch 414 coupled to the transistor 413 in series. The series connection of the transistor 413 and the switch 414 receives the predetermined reference voltage (Vref), and is coupled to the output terminal 412. The transistor 413 is coupled to the input terminal 411, and operable between an ON state and an OFF state based on the voltage at the input terminal 411. The switch 414 is coupled to the control terminal 416, and operable between an ON state and an OFF state based on the voltage at the control terminal 416. When the first controllable circuit 41 operates in the output enable state, both of the transistor 413 and the switch 414 operate in the ON state to allow transmission of the predetermined reference voltage (Vref) to the output terminal 412 through the series connection of the transistor 413 and the switch 414. When the first controllable circuit 41 operates in the output disable state, one of the transistor 413 and the switch 414 operates in the OFF state to prevent transmission of the predetermined reference voltage (Vref) to the output terminal 412 through the series connection of the transistor 413 and the switch 414. The switch 414 operates in the OFF state when none of the memory cells 211 (see FIG. 5) of the respective memory cell group 21 (see FIG. 5) is selected to have data stored therein be read, and operates in the ON state when one of the memory cells 211 (see FIG. 5) of the respective memory cell group 21 (see FIG. 5) is selected to have data stored therein be read. Notably, it may be that the transistor 413 receives the predetermined reference voltage (Vref) and the switch 414 is coupled to the output terminal 412 as shown in FIG. 8, or it may be that the transistor 413 is coupled to the output terminal 412 and the switch 414 receives the predetermined reference voltage (Vref). Moreover, the transistor 413 may be an N-channel field effect transistor (FET) as shown in FIG. 8 or alternatively a P-channel one. However, this invention is not limited to such configurations.

Figure 9:
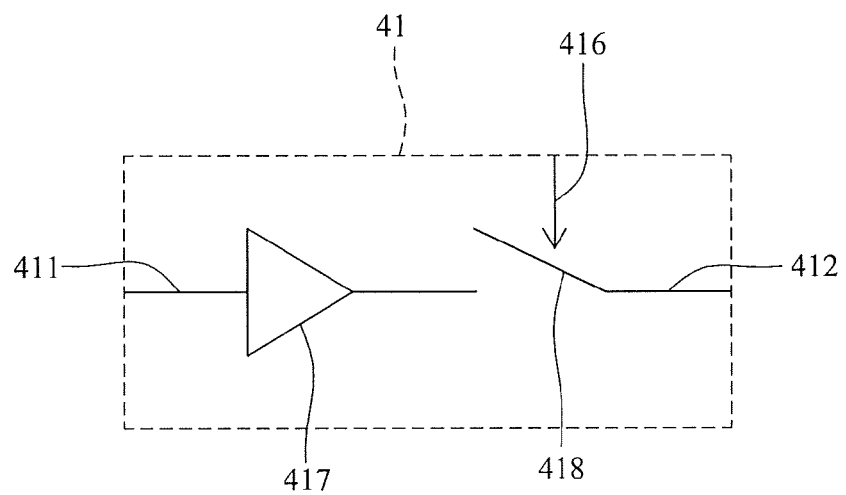
FIG. 9 is a schematic circuit diagram illustrating a second example of the first controllable circuit of the embodiment.
Figure 10:
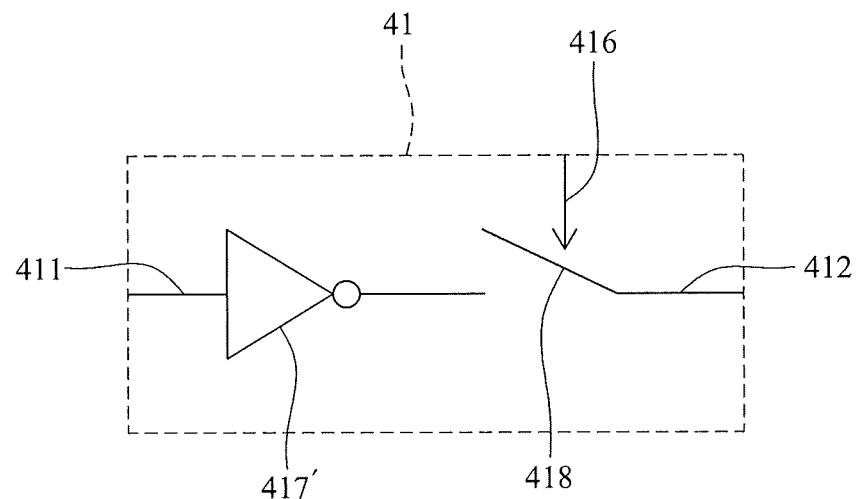
FIG. 10 is a schematic circuit diagram illustrating a third example of the first controllable circuit of the embodiment.
Figure 11:
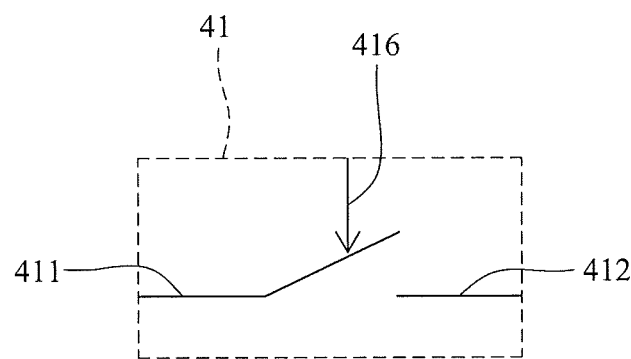
FIG. 11 is a schematic circuit diagrams illustrating a fourth example of the first controllable circuit of the embodiment.
Figure 12:
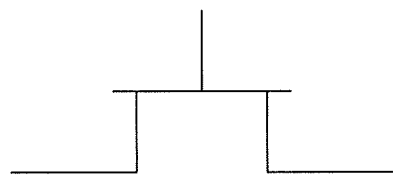
FIG. 12 a schematic circuit diagram illustrating an example of a switch of the embodiment.

FIGS. 9 to 11 illustrate different examples of the second implementation of the first controllable circuit 41. The first controllable circuit 41 may be a non-inverting tri-state buffer that is capable of increasing the output driving capability thereof (see FIG. 9), an inverting tri-state buffer that is capable of increasing the output driving capability thereof (see FIG. 10), or a switch that is incapable of increasing the output driving capability thereof (see FIG. 11), and that may be, for example, a FET shown in FIG. 12. As shown in FIG. 9, the first controllable circuit 41 may include a non-inverting buffer 417 and a switch 418 that are coupled in series between the input terminal 411 and the output terminal 412, with the non-inverting buffer 417 coupled to the input terminal 411 and the switch 418 coupled to the output terminal 412. The switch 418 is further coupled to the control terminal 416. As shown in FIG. 10, the non-inverting buffer 417 (see FIG. 9) of the first controllable circuit 41 may be replaced by an inverting buffer 417'. However, this invention is not limited to such configurations. For example, the first controllable circuit 41 may include a non-inverting or inverting buffer that is activated and deactivated respectively in the output enable state and the output disable state.

Referring to FIGS. 3 and 5, it is noted that when the first controllable circuit 41 is unable to increase the output driving capability thereof (i.e., is unable to assist in driving the corresponding second bit line (r_bitA_bkB)), a plurality of sense amplifiers (not shown) should be employed to assist in amplifying voltages on the second bit lines (r_bit0_bk0 to r_bit31_bk3) in order to facilitate data transmission and allow the memory device to operate at a higher frequency, where $0 \le A \le L-1$ (i.e., $0 \le A \le 31$) and $0 \le B \le M-1$ (i.e., $0 \le B \le 3$).

Figure 13:
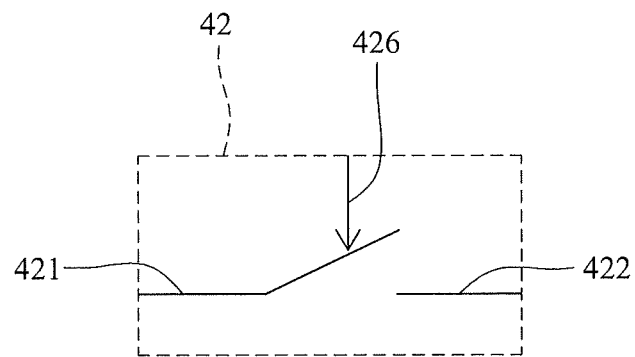
FIG. 13 is a schematic circuit diagram illustrating a second controllable circuit of the embodiment.

Referring to FIG. 6, each second controllable circuit 42 is operable between an output enable state and an output disable state based on a voltage at the control terminal 426 thereof, outputs, at the output terminal 422 thereof, a voltage associated with a voltage at the input terminal 421 thereof when operating in the output enable state, and does not output any voltage at the output terminal 422 thereof (i.e., exhibits high impedance at the output terminal 422 thereof) when operating in the output disable state. In addition, each second controllable circuit 42 is controlled via the corresponding second control line (w_ctrC_bkB) to operate in the output disable state when none of the memory cells 211 of the respective memory cell group 21 is selected to have data written thereinto, and to operate in the output enable state when one of the memory cells 211 of the respective memory cell group 21 is selected to have data written thereinto, where $0 \le B \le M-1$ (i.e., $0 \le B \le 3$) and $0 \le C \le N-1$ (i.e., $0 \le C \le 63$). As shown in FIG. 13, in this embodiment, the second controllable circuit 42 is a switch. The switch (see FIG. 13) may be, for example, a FET shown in FIG. 12. However, this invention is not limited to such configuration.

Figure 14:
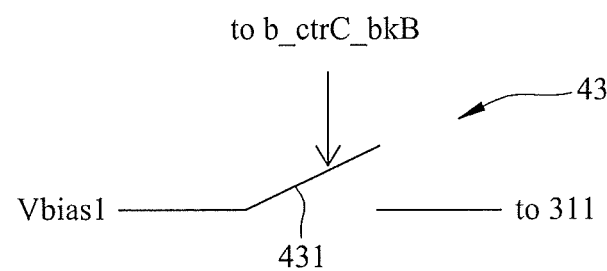
FIG. 14 is a schematic circuit diagram illustrating a first biasing circuit of the embodiment.

Referring to FIG. 7, each first biasing circuit 43 is controlled via the corresponding first bias line (b_ctrC_bkB) to supply a first predetermined bias voltage (e.g., one of the logic high voltage and the logic low voltage) to the respective first bit line 311 when none of the memory cells 211 of the respective memory cell group 21 outputs data stored therein to the respective first bit line 311, where $0 \le B \le M-1$ (i.e., $0 \le B \le 3$) and $0 \le C \le N-1$ (i.e., $0 \le C \le 63$). As shown in FIG. 14, in this embodiment, the first biasing circuit 43 includes a switch 431 having a first terminal that is coupled to the respective first bit line 311, a second terminal that receives the first predetermined bias voltage (Vbias1), and a control terminal that is coupled to the corresponding first bias line (b_ctrC_bkB). The switch 431 may be, for example, a FET shown in FIG. 12. However, this invention is not limited to such configuration. For example, the first biasing circuit 43 may include a resistor (not shown) having a first terminal that is coupled to the respective first bit line 311, and a second terminal that receives the first predetermined bias voltage (Vbias1), in which case the first bias lines (b_ctr0_bk0 to b_ctr63_bk3) are omitted.

It is noted that, in other embodiments, the memory device may include a number (N) (i.e., 64) of first bias line (b_ctr0_bk0 to b_ctr63_bk0), instead of the M×N (i.e., 4×64=256) number of first bias lines (b_ctr0_bk0 to b_ctr63_bk3). In this case, each first bias line (b_ctrC_bk0) is coupled to a corresponding first biasing circuit 43 of each memory unit 20, and the first biasing circuits 43 coupled to the first bias line (b_ctrC_bk0) supply the first predetermined bias voltage (Vbias1) to the respective first bit lines 311 when none of the memory cells 211 corresponding to the first bias line (b_ctrC_bk0) outputs data stored therein to the corresponding first bit line 311, where $0 \leq C \leq N-1$ (i.e., $0 \leq C \leq 63$).

Moreover, in other embodiments, the first biasing circuits 43 may be omitted in one of the following conditions: (a) each first controllable circuit 41 has the configuration shown in FIG. 8; (b) each first controllable circuit 41 has the configuration shown in FIG. 11; (c) each memory cell group 21 further includes a dummy cell (not shown) for supplying the first predetermined bias voltage to the respective first bit line 311; and (d) one of the memory cells 211 of each memory cell group 21 serves as a parking cell for outputting data stored therein to bias the respective first bit line 311. In condition (a), when none of the memory cells 211 of each memory cell group 21 outputs data stored therein to the respective first bit line 311, the switch 414 (see FIG. 8) of the respective first controllable circuit 41 operates in the OFF state, and no current can flow through the respective first controllable circuit 41 even if the input terminal 411 of the respective first controllable circuit 41 is floating. As a result, the first biasing circuits 43 may be omitted in condition (a). In condition (c) or (d), since each first bit line 311 is biased by the dummy cell or the parking cell of the respective memory cell group 21 instead of the respective first controllable circuit 41, the memory device has relatively low design complexity, thereby reducing design time and costs.

It is noted that, in this embodiment, since each first biasing circuit 43 supplies the first predetermined bias voltage to the input terminal 411 of the respective first controllable circuit 41 having the configuration shown in FIG. 9 or 10 when none of the memory cells 211 of the respective memory cell group 21 outputs data stored therein to the input terminal 411 of the respective first controllable circuit 41, the input terminal 411 of the respective first controllable circuit 41 will not be floating, thereby preventing unnecessary power consumption by the memory device.

Figure 15:
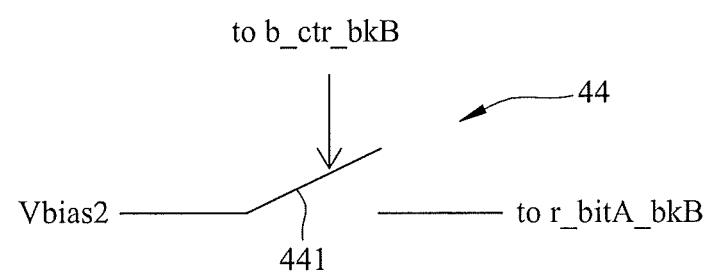
FIG. 15 is a schematic circuit diagram illustrating a second biasing circuit of the embodiment.

Each second biasing circuit 44 is controlled via the corresponding second bias line (b_ctr_bkB) to supply a second predetermined bias voltage (e.g., one of the logic high voltage and the logic low voltage) to the respective second bit line (r_bitA_bkB) when none of the corresponding first controllable circuits 41 operates in the output enable state, where $0 \leq A \leq L-1$ (i.e., $0 \leq A \leq 31$) and $0 \leq B \leq M-1$ (i.e., $0 \leq B \leq 3$). As shown in FIG. 15, in this embodiment, the second biasing circuit 44 includes a switch 441 having a first terminal that is coupled to the respective second bit line (r_bitA_bkB), a second terminal that receives the second predetermined bias voltage (Vbias2), and a control terminal that is coupled to the corresponding second bias line (b_ctr_bkB). However, this invention is not limited to such configuration. For example, each second biasing circuit 44 may include a resistor (not shown) having a first terminal that is coupled to the respective second bit line (r_bitA_bkB), and a second terminal that receives the second predetermined bias voltage (Vbias2), in which case the second bias lines (b_ctr_bk0 to b_ctr_bk3) are omitted.

It is noted that, in other embodiments, the memory device may include only one second bias line (b_ctr_bk0), instead of four second bias lines (b_ctr_bk0 to b_ctr_bk3). In this case, all of the second biasing circuits 44 are coupled to the second bias line (b_ctr_bk0), and each of the same supplies the second predetermined bias voltage (Vbias2) to the respective second bit line (r_bitA_bkB) when none of the first controllable circuits 41 operates in the output enable state, where $0 \leq A \leq L-1$ (i.e., $0 \leq A \leq 31$) and $0 \leq B \leq M-1$ (i.e., $0 \leq B \leq 3$).

Moreover, in other embodiments, the second biasing circuits 44 may be omitted. In this case, the second bit lines (r_bitA_bkB) are adapted to be coupled to an external circuit that can supply the second predetermined bias voltage (Vbias2) thereto, where $0 \leq A \leq L-1$ (i.e., $0 \leq A \leq 31$) and $0 \leq B \leq M-1$ (i.e., $0 \leq B \leq 3$).

Referring to FIGS. 3 and 5 to 7, in this embodiment, the memory cell groups 21 are arranged in a matrix with a number (N) (i.e., 64) of rows and a number (L×M) (i.e., 32×4=128) of columns, and are divided into a number (M) (i.e., 4) of memory cell blocks. The memory cell groups 21 of each memory cell block form a matrix with a number (N) (i.e., 64) of rows and a number (L) (i.e., 32) of columns. A $B^{th}$ one of the memory cell blocks is controlled via the first control lines (r_ctr0_bkB to r_ctr63_bkB), the second control lines (w_ctr0_bkB to w_ctr63_bkB), the first bias lines (b_ctr0_bkB to b_ctr63_bkB) and the second bias line (b_ctr_bkB), such that data are written into the memory cell groups 21 of each row through the fourth bit lines (w_bit0_bkB to w_bit31_bkB), the corresponding second controllable circuits 42 operating in the output enable state and the corresponding third bit lines 321, and such that data stored in the memory cell groups 21 of each row are read through the corresponding first bit lines 311, the corresponding first controllable circuits 41 operating in the output enable state and the second bit lines (r_bit0_bkB to r_bit31_bkB), where $0 \leq B \leq M-1$ (i.e., $0 \leq B \leq 3$). The memory cell blocks are written or read one at a time. Preferably, the columns of the memory cells 211 of the memory cell blocks are arranged in the order of the first column of the first memory cell block, the first column of the second memory cell block, the first column of the third memory cell block, the first column of the fourth memory cell block, the second column of the first memory cell block, the second column of the second memory cell block, . . . so on and so forth to the thirty-second column of the fourth memory cell block, in order to facilitate routing of the first bit lines (r_bit0_bk0 to r_bit31_bk3) and to decrease capacitances seen at the same.

Preferably, since the memory cell blocks are written one at a time and since each fourth bit line (w_bitA_bkB) is driven individually by a driving circuit (not shown) when one of the corresponding memory cells 211 is selected to have data written thereinto such that at most L (i.e., 32) number of the fourth bit lines (w_bit0_bkB to w_bit31_bkB) are driven at one time, unnecessary power consumption by the driving circuit is prevented, where $0 \leq A \leq L-1$ (i.e., $0 \leq A \leq 31$) and $0 \leq B \leq M-1$ (i.e., $0 \leq B \leq 3$).

Figure 16:
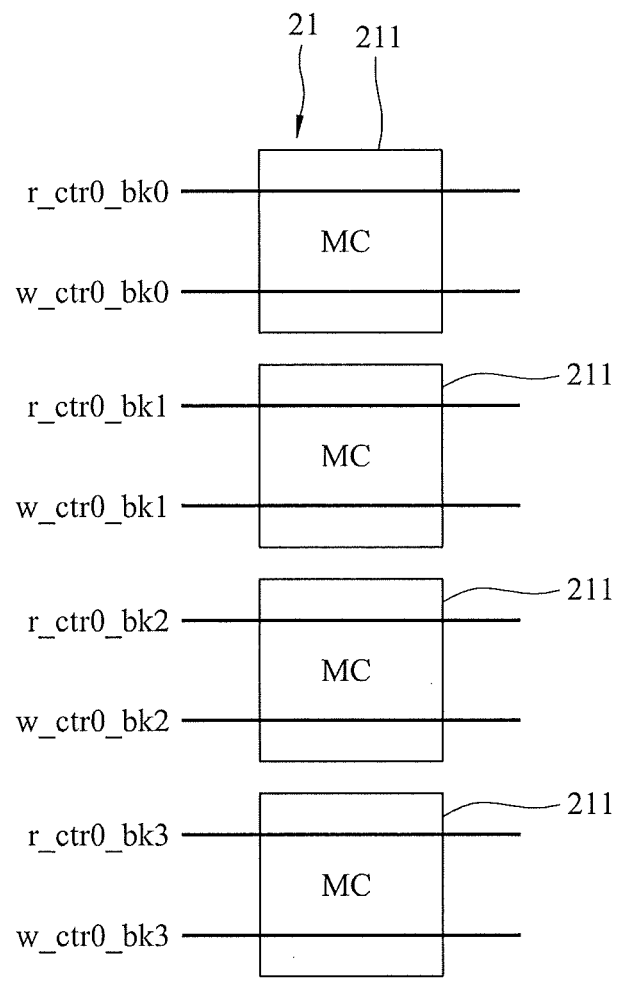
FIG. 16 is a schematic layout diagram illustrating the embodiment.

Referring to FIG. 16, with shrinking of dimensions of the memory device, one metal layer can provide at most about three traces passing over each memory cell 211. Therefore, one metal layer can provided at most about twelve traces passing over four memory cells 211. In this embodiment, since each memory cell group 21 includes four memory cells 211, since the first controllable circuits 41 (see FIG. 5)

corresponding to each row are controlled via four first control lines (r_ctrC_bk0 to r_ctrC_bk3), and since the second controllable circuits 42 (see FIG. 6) corresponding to each row are controlled via four second control lines (w_ctrC_bk0 to w_ctrC_bk3), these eight control lines (r_ctrC_bk0 to r_ctrC_bk3, w_ctrC_bk0 to w_ctrC_bk3) can be formed in one metal layer to pass over each corresponding memory cell group 21, where $0 \leq B \leq M-1$ (i.e., $0 \leq B \leq 3$) and $0 \leq C \leq N-1$ (i.e., $0 \leq C \leq 63$). As a result, at most one more metal layer is needed for fabrication of the memory device of this embodiment compared to the conventional memory device.

Referring to FIGS. 5 to 7, it is noted that, in this embodiment, each memory cell 211 is read and written at different terminals. However, in other embodiments, each memory cell 211 may be read and written at the same terminal, in which case the third bit lines 321 are omitted, each second controllable circuit 42 is coupled to a respective first bit line 311 instead, and each first biasing circuit 43 supplies the first predetermined bias voltage to the respective first bit line 311 when none of the memory cells 211 of the respective memory cell group 21 outputs data stored therein and when the respective second controllable circuit 42 operates in the output disable state.

In addition, in this embodiment, the memory cell blocks are controlled individually, i.e., the $B^{th}$ one of the memory cell blocks is controlled via the control lines (r_ctr0_bkB to r_ctr63_bkB, w_ctr0_bkB to w_ctr63_bkB) and the bias lines (b_ctr0_bkB to b_ctr63_bkB, b_ctr_bkB), where $0 \leq B \leq M-1$ (i.e., $0 \leq B \leq 3$). However, this invention is not limited to such configuration. For example, the memory device may include one-hundred-and-twenty-eight first control lines (r_ctr0_bk0 to r_ctr63_bk1), one-hundred-and-twenty-eight second control lines (w_ctr0_bk0 to w_ctr63_bk1), one-hundred-and-twenty-eight first bias lines (b_ctr0_bk0 to b_ctr63_bk1) and two second bias lines (b_ctr_bk0 to b_ctr_bk1), with two of the memory cell blocks being controlled via the control lines (r_ctr0_bk0 to r_ctr63_bk0, w_ctr0_bk0 to w_ctr63_bk0) and the bias lines (r_ctr0_bk0 to r_ctr63_bk0, r_ctr_bk0), and the other two of the memory cell blocks being controlled via the control lines (r_ctr0_bk1 to r_ctr63_bk1, w_ctr0_bk1 to w_ctr63_bk1) and the bias lines (r_ctr0_bk1 to r_ctr63_bk1, r_ctr_bk1), thereby decreasing the total number of the control lines (r_ctr0_bk0 to r_ctr63_bk1, w_ctr0_bk0 to w_ctr63_bk1) and the total number of the bias lines (b_ctr_bk0 to b_ctr_bk1, b_ctr_bk0 to b_ctr_bk1).

Moreover, in other embodiments, each multiplexer 9 may be replaced by, for example, an AND gate (not shown) or an OR gate (not shown).

In view of the above, the memory device of this embodiment has the following advantages:

1. When thirty-two of the memory cells 211 that correspond to the second bit lines (r_bit0_bkB to r_bit31_bkB) and to the first control line (r_ctrC_bkB) are selected to have data stored therein be read, only these thirty-two memory cells 13 may charge or discharge the corresponding second bit lines (r_bit0_bkB to r_bit31_bkB), where $0 \leq B \leq M-1$ (i.e., $0 \leq B \leq 3$) and $0 \leq C \leq N-1$ (i.e., $0 \leq C \leq 63$). This prevents unnecessary power consumption by the memory device of this embodiment.

Figure 1:
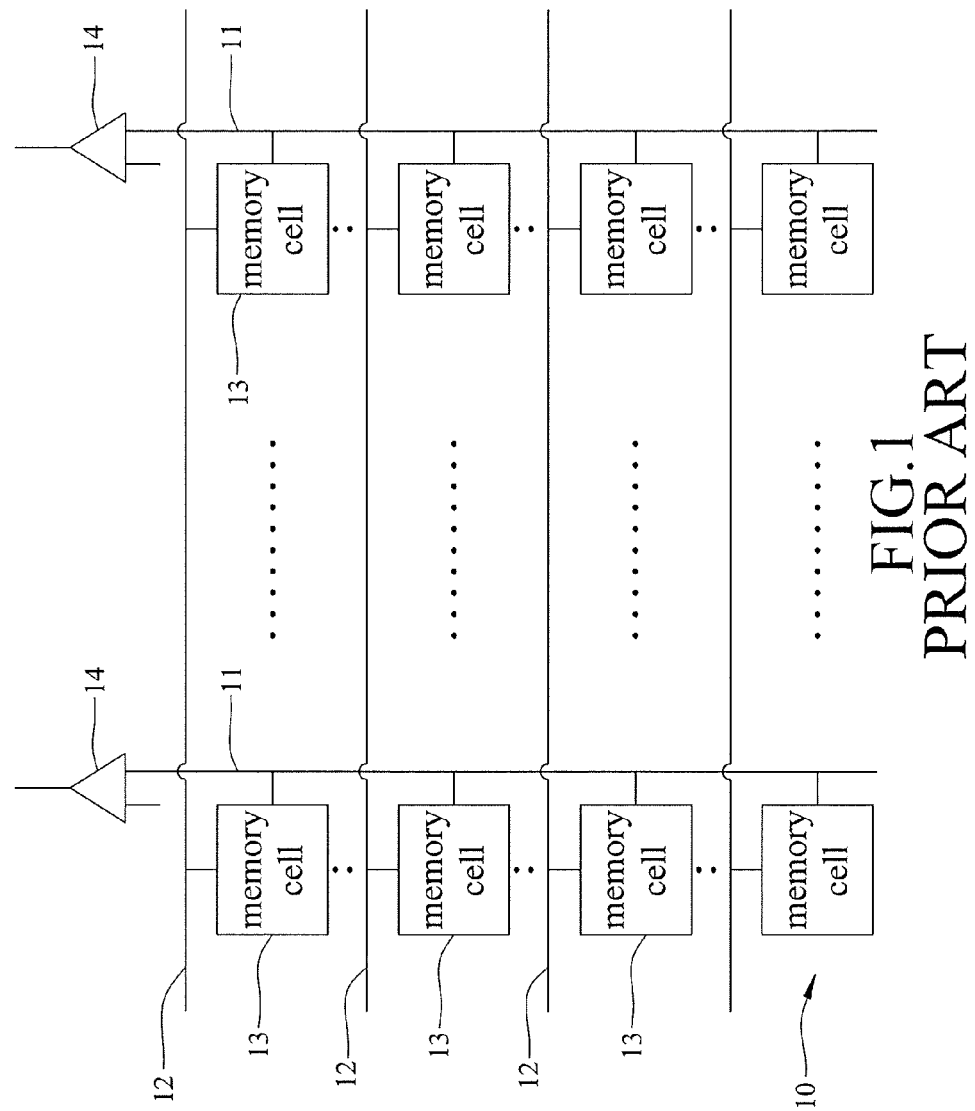
FIG. 1 is a schematic circuit block diagram illustrating a conventional memory device.
Figure 2:
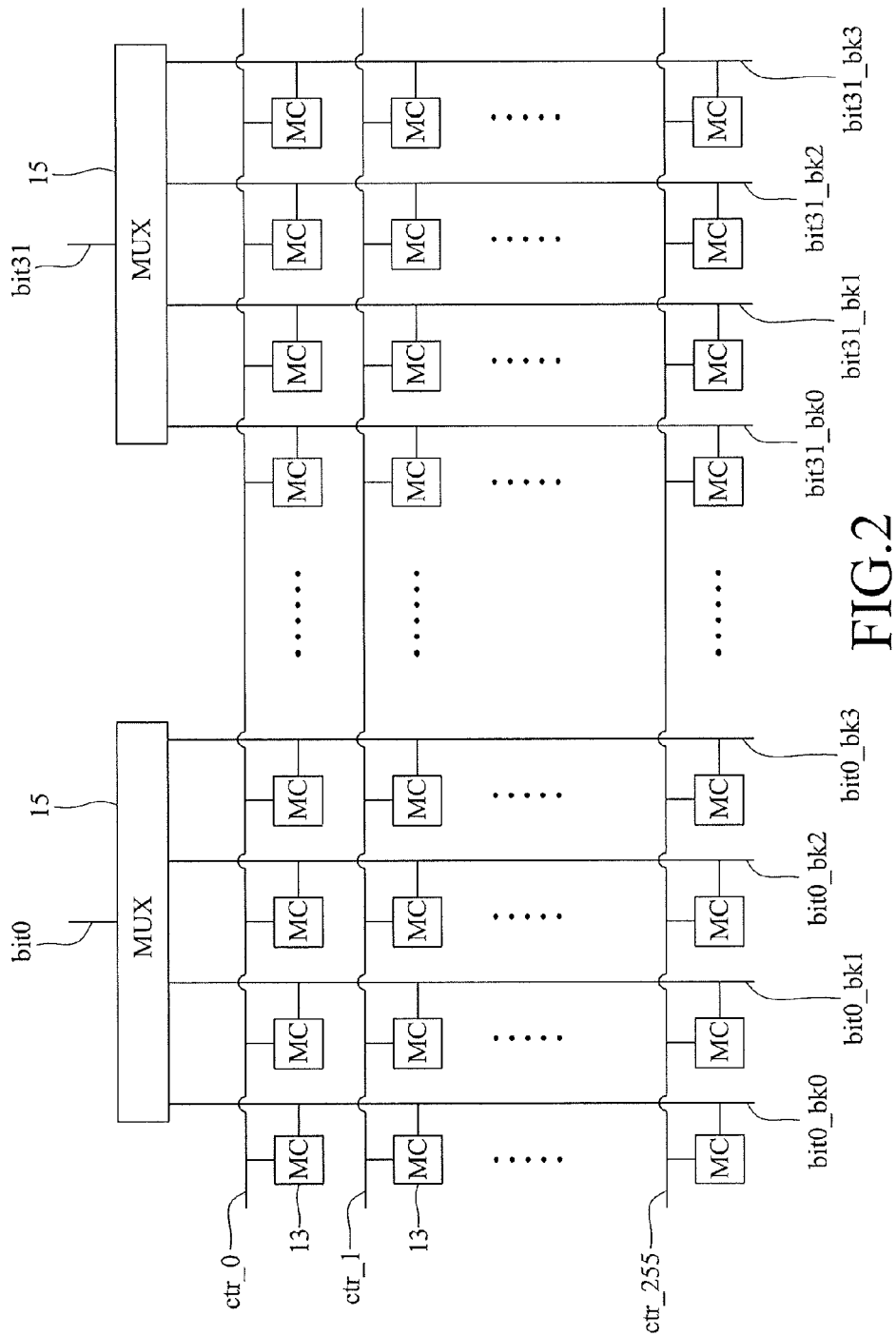
FIG. 2 is a schematic circuit block diagram illustrating a variation of the conventional memory device.

2. Since each first bit line 311 is relatively short and is coupled to a relatively small number (i.e., 4 instead of 256) of memory cells 211, a capacitance seen thereat can be reduced to ¹⁄₆₄ that of the conventional memory device (see FIG. 1). When each first controllable circuit 41 assists in driving the corresponding second bit line (r_bitA_bkB), an output resistance thereof can be very small, where $0 \leq A \leq L-1$ (i.e., $0 \leq A \leq 31$) and $0 \leq B \leq M-1$ (i.e., $0 \leq B \leq 3$). Therefore, it is relatively easy for the memory device of this embodiment to be read at a relatively high frequency compared to the conventional memory device (see FIG. 1).

3. When each first controllable circuit 41 assists in driving the corresponding second bit line (r_bitA_bkB), a sense amplifier is not required, thereby reducing overall power consumption of the memory device of this embodiment, where $0 \leq A \leq L-1$ (i.e., $0 \leq A \leq 31$) and $0 \leq B \leq M-1$ (i.e., $0 \leq B \leq 3$).

While this invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A memory device comprising:
   a plurality of memory modules arranged in a first direction, each of said memory modules including a plurality of memory units arranged in the first direction, each of said memory units of said memory modules including
   a plurality of memory cell groups which are arranged in a second direction different from the first direction, and each of which includes at least one memory cell for storing data therein,
   a plurality of first bit lines, each of which is coupled to said at least one memory cell of a respective one of said memory cell groups,
   a second bit line for transmitting to-be-read data, and
   a plurality of first controllable circuits, each of which has an input terminal coupled to a respective one of said first bit lines, an output terminal coupled to said second bit line, and a control terminal; and
   a plurality of first control line groups, each of said first control line groups including a plurality of first control lines, each of said first control line groups corresponding to a plurality of memory cell groups along the first direction, each of said first control lines of said first control line groups being coupled to said control terminal of a corresponding one of said first controllable circuits of at least one of said memory units of each of said memory modules;
   wherein each of said memory module outputs data transmitted from one of the second bit lines corresponding to a selected memory units;
   wherein, each of said first controllable circuits of said memory units of said memory modules is operable between an output enable state and an output disable state based on a voltage at said control terminal of a corresponding one of said first controllable circuits, and outputs, at said output terminal, a voltage associated with a voltage at said input terminal when operating in the output enable state; or
   wherein, each of said first controllable circuits of said memory units of said memory modules is operable between the output enable state and the output disable state based on the voltage at said input terminal and the voltage at said control terminal, and outputs a predetermined reference voltage at said output terminal when operating in the output enable state;
   wherein said plurality of first bit lines is not directly connected to said second bit line.

2. The memory device of claim 1, wherein each of said first controllable circuits of said memory units of said memory modules has an increased output driving capability.

3. The memory device of claim 2, wherein each of said first controllable circuits of said memory units of said memory modules includes a transistor for increasing the output driving capability, and a switch coupled to said transistor in series.

4. The memory device of claim 2, wherein each of said first controllable circuits of said memory units of said memory modules is a non-inverting tri-state buffer.

5. The memory device of claim 4, wherein each of said first controllable circuits of said memory units of said memory modules includes a non-inverting buffer and a switch that are coupled in series.

6. The memory device of claim 2, wherein each of said first controllable circuits of said memory units of said memory modules is an inverting tri-state buffer.

7. The memory device of claim 6, wherein each of said first controllable circuits of said memory units of said memory modules includes an inverting buffer and a switch that are coupled in series.

8. The memory device of claim 1, wherein said first control lines are formed in one metal layer.

9. The memory device of claim 1, wherein each of said first controllable circuits of said memory units of said memory modules is a switch.

10. The memory device of claim 1, wherein each of said memory units of said memory modules further includes:

a plurality of third bit lines, each of which is coupled to said at least one memory cell of a respective one of said memory groups;

a fourth bit line for transmitting to-be-written data; and a plurality of second controllable circuits, each of which has an input terminal coupled to said fourth bit line, an output terminal coupled to a respective one of said third bit lines, and a control terminal;

said memory device further comprising a plurality of second control lines, each of which is coupled to said control terminal of a corresponding one of said second controllable circuits of each of at least one of said memory units of each of said memory modules;

each of said second controllable circuits of said memory units of said memory modules is operable between an output enable state and an output disable state based on a voltage at said control terminal of a corresponding one of said first controllable circuits, and outputs, at said output terminal, a voltage associated with a voltage at said input terminal when operating in the output enable state.

11. The memory device of claim 10, wherein each of said second controllable circuits of said memory units of said memory modules is a switch.

12. The memory device of claim 10, wherein said first and second control lines are formed in one metal layer.

* * * * *